(12) United States Patent
Wang et al.

(10) Patent No.: US 8,367,462 B2
(45) Date of Patent: Feb. 5, 2013

(54) LARGE-SCALE FABRICATION OF VERTICALLY ALIGNED ZNO NANOWIRE ARRAYS

(75) Inventors: Zhong L. Wang, Marietta, GA (US); Suman Das, Atlanta, GA (US); Sheng Xu, Atlanta, GA (US); Dajun Yuan, Atlanta, GA (US); Rui Guo, Atlanta, GA (US); Yaguang Wei, Atlanta, GA (US); Wenzhuo Wu, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 175 days.

(21) Appl. No.: 13/091,855

(22) Filed: Apr. 21, 2011

(65) Prior Publication Data
US 2011/0309354 A1 Dec. 22, 2011

Related U.S. Application Data

(60) Provisional application No. 61/326,422, filed on Apr. 21, 2010, provisional application No. 61/328,222, filed on Apr. 27, 2010, provisional application No. 61/385,338, filed on Sep. 22, 2010.

(51) Int. Cl.
*H01L 33/26* (2010.01)
*H01L 33/04* (2010.01)
*H01L 21/36* (2006.01)
*B82Y 40/00* (2011.01)

(52) U.S. Cl. .................. 438/104; 257/43; 257/E33.005; 257/E33.013; 257/E21.461

(58) Field of Classification Search .................. 438/104, 438/46; 257/43, E33.005, E33.013, E21.461
See application file for complete search history.

(56) References Cited

U.S. PATENT DOCUMENTS

| | | | |
|---|---|---|---|
| 4,011,745 A | 3/1977 | Gatos et al. | |
| 6,559,550 B2 | 5/2003 | Herman | |
| 6,999,221 B1 | 2/2006 | Sarkisov et al. | |
| 7,220,310 B2 | 5/2007 | Wang et al. | |
| 7,351,607 B2 | 4/2008 | Wang et al. | |
| 7,408,366 B2 | 8/2008 | Wang et al. | |
| 7,426,025 B2 | 9/2008 | Wang et al. | |
| 7,705,523 B2 | 4/2010 | Wang et al. | |
| 7,898,156 B2 | 3/2011 | Wang et al. | |
| 7,975,363 B2 | 7/2011 | Wang et al. | |
| 7,982,370 B2 | 7/2011 | Wang et al. | |
| 2003/0205657 A1 | 11/2003 | Voisin | |
| 2004/0127025 A1 | 7/2004 | Crocker, Jr. et al. | |
| 2005/0188751 A1 | 9/2005 | Puskas | |

(Continued)

OTHER PUBLICATIONS

Jeon et al., "MEMS power generator with transverse mode thin film PCT," Science Direct, vol. 122, Issue 1, Jul. 29, 2005, pp. 16-22.

(Continued)

*Primary Examiner* — Calvin Lee
*Assistant Examiner* — Monica D Harrison
(74) *Attorney, Agent, or Firm* — Bryan W. Bockhop; Bockhop & Associates, LLC

(57) ABSTRACT

In a method for growing a nanowire array, a photoresist layer is placed onto a nanowire growth layer configured for growing nanowires therefrom. The photoresist layer is exposed to a coherent light interference pattern that includes periodically alternately spaced dark bands and light bands along a first orientation. The photoresist layer exposed to the coherent light interference pattern along a second orientation, transverse to the first orientation. The photoresist layer developed so as to remove photoresist from areas corresponding to areas of intersection of the dark bands of the interference pattern along the first orientation and the dark bands of the interference pattern along the second orientation, thereby leaving an ordered array of holes passing through the photoresist layer. The photoresist layer and the nanowire growth layer are placed into a nanowire growth environment, thereby growing nanowires from the nanowire growth layer through the array of holes.

18 Claims, 3 Drawing Sheets

U.S. PATENT DOCUMENTS

| | | | |
|---|---|---|---|
| 2005/0242366 A1 | 11/2005 | Parikh et al. | |
| 2006/0292839 A1* | 12/2006 | Yi et al. | 438/570 |
| 2008/0067618 A1 | 3/2008 | Wang et al. | |
| 2009/0066195 A1 | 3/2009 | Wang et al. | |
| 2009/0115293 A1 | 5/2009 | Wang et al. | |
| 2009/0179523 A1 | 7/2009 | Wang et al. | |
| 2009/0209303 A1 | 8/2009 | Kroll et al. | |
| 2009/0301196 A1 | 12/2009 | Wang et al. | |
| 2009/0309456 A1 | 12/2009 | Stollberg | |
| 2009/0322218 A1 | 12/2009 | Wang et al. | |
| 2010/0026142 A1 | 2/2010 | Jones et al. | |
| 2010/0056851 A1 | 3/2010 | Wang et al. | |
| 2010/0117488 A1 | 5/2010 | Wang et al. | |
| 2010/0147371 A1 | 6/2010 | Cho | |
| 2010/0171095 A1 | 7/2010 | Wang et al. | |
| 2010/0191153 A1 | 7/2010 | Sanders et al. | |
| 2010/0258160 A1 | 10/2010 | Wang et al. | |
| 2010/0326503 A1 | 12/2010 | Wang et al. | |
| 2011/0006286 A1 | 1/2011 | Wang et al. | |
| 2011/0168969 A1 | 7/2011 | Wang et al. | |

OTHER PUBLICATIONS

Gao et al., Nanoarchitectures of semiconducting and piezoelectric zinc oxide, J. Applied Physics 97, 044304 (2005).

Wang et al., "Large-Size Liftable Inverted-Nanobowl Sheets as Reusable Masks for Nanolithography," Nano Letters, vol. 5, No. 9, 2005, 1748-1788.

Lao et al., "Formation of double-side teethed nanocombs of ZnO and self-catalysis of Zn-terminated polar surface," Chemical Physics Letters, Elsevier B.V., 2005.

Jeon et al., "MEMS power generator with transverse mode thin film PZT," Sensors and Actuators A Physical, Elsevier, (2005).

Lao et al., "Formation of double-side teethed nanocombs of ZnO and self-calalysis of Zn-terminated polar surface," Chemical Physics Letters (Science Direct), (Abstract), 2007.

Wang et al., "Large-Size Liftable Inverted-Nanobowl Sheets as REusable Masks for Nanolithography," Nano Letters, vol. 5, (Abstract), 2005.

Wang et al., "Piezoelectric Nanogenerators Based on Zinc Oxide Nanowire Arrays," Science, vol. 312, pp. 242-245, Apr. 14, 2006.

Peck-Radosavjevic et al., "Thrombopoietin induces rapid resolution of thrombocytopenia after orthotopic liver transplantation through increased platelet production," Blood, vol. 95, No. 3, (2000).

* cited by examiner

LARGE-SCALE FABRICATION OF VERTICALLY ALIGNED ZNO NANOWIRE ARRAYS

CROSS-REFERENCE TO RELATED APPLICATIONS

This application claims the benefit of U.S. Provisional patent application Ser. No. 61/385,338, filed Sep. 22, 2010, the entirety of which is hereby incorporated herein by reference. This application also claims the benefit of U.S. Provisional patent application Ser. No. 61/326,422, filed Apr. 21, 2010, the entirety of which is hereby incorporated herein by reference. This application also claims the benefit of U.S. Provisional patent application Ser. No. 61/328,222, filed Apr. 27, 2010, the entirety of which is hereby incorporated herein by reference.

STATEMENT OF GOVERNMENT INTEREST

This invention was made with government support under contract No. DE-FG02-07ER46394, awarded by the Department of Energy and under contract No. W31P4Q-08-1-0009, awarded by the Department of the Army. The government has certain rights in the invention.

BACKGROUND OF THE INVENTION

1. Field of the Invention

The present invention relates to nanostructures and, more specifically, to arrays of vertically aligned nanostructures.

2. Description of the Related Art

ZnO nanowires (NW) are one-dimensional nanostructured building blocks that have been used in energy harvesting, sensing, optoelectronic and electronic applications. Assembly and integration of highly-ordered nanowire arrays at large scales is important for multi-functional devices and systems. Efforts have been made to assemble large quantity nanowires through two parallel processes: grow-and-place (GAP) and grow-in-place (GIP). The GAP approach includes alignment induced by dielectrophoresis and methods utilizing magnetic fields, as well as microfluidic, electrostatic, molecular, and shear forces. Although the GAP technique can be used to fabricate a finite number of devices, it is rather challenging to assemble the as-synthesized nanowires into desired configurations at large scale. In GIP technique, nanostructures grow in-situ at the patterned catalyst/seed sites created through lithography, such as electron beam lithography (EBL), nanoimprint lithography (NIL), and nano-sphere lithography (NSL). Control over the growth substrate can guide the size, placement, and orientation of the grown nanowires. Patterned growth of aligned ZnO nanowires has been achieved via the hydrothermal (HT) method and physical vapor deposition (PVD). However, none of the above approaches provides a reliable, high-throughput, and low-cost solution for large scale fabrication of patterned ZnO nanowire arrays at a level required for industrial applications.

Therefore, there is a need for a reliable, high-throughput, and low-cost method for large scale fabrication of patterned ZnO nanowire arrays

SUMMARY OF THE INVENTION

The disadvantages of the prior art are overcome by the present invention which, in one aspect, is a method for growing a nanowire array in which a photoresist layer is placed onto a nanowire growth layer configured for growing nanowires therefrom. The photoresist layer is exposed to a coherent light interference pattern that includes periodically alternately spaced dark bands and light bands along a first orientation. The photoresist layer exposed to the coherent light interference pattern along a second orientation, transverse to the first orientation. The photoresist layer developed so as to remove photoresist from areas corresponding to areas of intersection of the dark bands of the interference pattern along the first orientation and the dark bands of the interference pattern along the second orientation, thereby leaving an ordered array of holes passing through the photoresist layer. The photoresist layer and the nanowire growth layer are placed into a nanowire growth environment, thereby growing nanowires from the nanowire growth layer through the array of holes.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
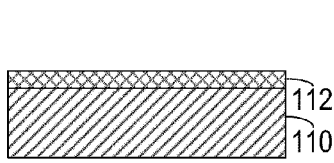
FIGS. 1A-1K are schematic diagrams showing one embodiment of a method of generating an ordered array of nanowires.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 1B:
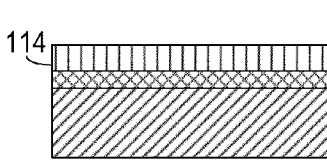
Figure 1C:
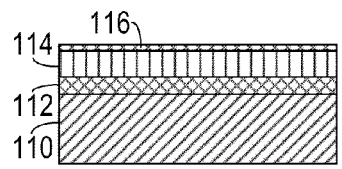
Figure 1D:
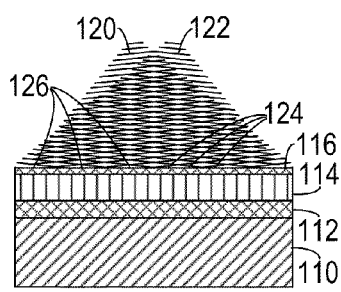
Figure 1E:
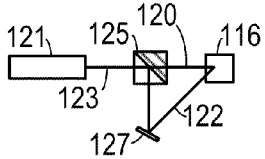

As shown in FIGS. 1A-1C, (which are cross-sectional views) one embodiment of a method of making nanowire arrays involves applying a ZnO seed layer 112 to a substrate 110, and then growing a layer 114 of dense nanowires 114 from the seed layer 112. A photoresist layer 116 is applied to layer 114 and the photoresist layer 116 is exposed to an interference pattern resulting from the interference of a first laser beam 120 and a second laser beam 122 (which can be a beam split from the first laser beam). One apparatus for generating such an interference pattern is shown in FIG. 1E, in which a laser 121 generates a light beam 123 that is split by a beam splitter 125 into the first laser beam 120 and the second laser beam 122. The second laser beam 122 is reflected by a mirror 127 so that both laser beams are directed to the photoresist layer 116 in a way such that they generate an interference pattern.

Figure 1F:
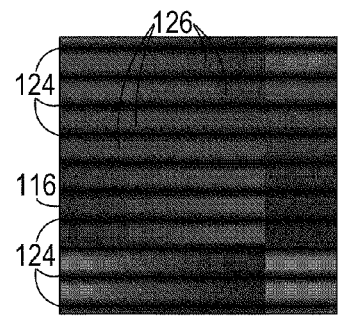
Figure 1G:
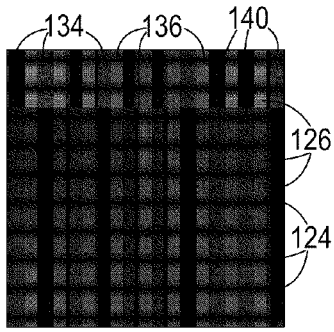

This interference pattern is shown in a top view in FIG. 1F and includes light bands 126 alternating with dark bands 124 that are evenly spaced apart. After sufficient exposure to the interference pattern to cause the photoresist to cross link in the areas of the light bands 126, the substrate 110 is rotated 90° (or a different angle in certain embodiments) and the photoresist layer 116 is exposed again to the laser interference pattern. This exposure results in a second set of spaced apart light bands 136 alternating with dark bands 134 and unexposed areas 140 at the intersections of the dark bands 124 and 134.

Figure 1H:
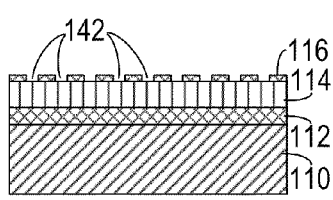
Figure 1I:
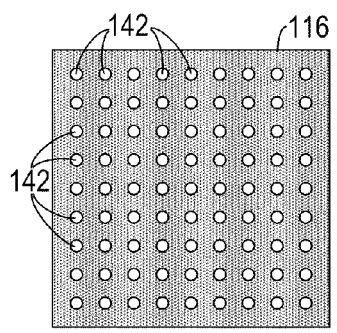
Figure 1J:
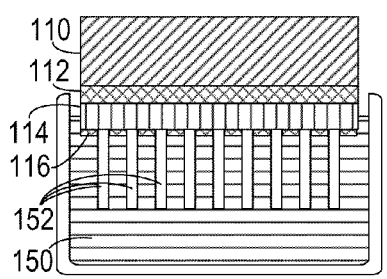
Figure 1K:
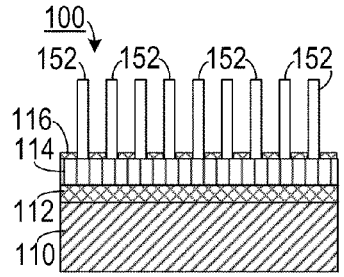

As shown in FIG. 1H (a cross sectional view) and FIG. 1I (a top view) after the photoresist layer 116 is developed an array of holes 142 is formed in the photoresist layer 116 in the portions corresponding to the intersection areas 140. As shown in FIG. 1J, the system is placed with the holes pointing downwardly into an environment 150 for growing nanowires 152, which grow through the holes in the photoresist layer 116. A resulting nanowire array 100 is shown in FIG. 1K.

One experimental embodiment allows for patterned growth of vertically aligned ZnO nanowire arrays with high-throughput and low-cost at wafer-scale without using clean room technology. Periodic hole patterns are generated using laser interference lithography on substrates coated with the photoresist SU-8. ZnO nanowires are selectively grown through the holes via a low temperature hydrothermal method without using catalyst and with a superior control over orientation, location/density and as-synthesized morphology. The development of a textured ZnO seed layer for replacing single crystalline GaN and ZnO substrates allows for large-scale fabrication of vertically aligned ZnO nanowire arrays on substrates of other materials such as polymers, silicon and glass. This allows for the manufacture of large-scale patterned one-dimensional nanostructures on various substrates for applications in energy harvesting, sensing, optoelectronics and electronic devices.

In this embodiment, patterned growth of vertically aligned ZnO nanowire arrays are generated by combining laser interference lithography, which is a large-scale, fast, maskless, and noncontact nanopatterning technique, and hydrothermal growth of ZnO nanowires either homoepitaxially on a textured ZnO layer, which is also synthesized wet-chemically, or heteroepitaxially on a GaN film. The substrates can be patterned using laser interference lithography. Aligned vertical ZnO nanowire arrays are then grown at predefined positions via a low temperature hydrothermal method without needing a catalyst and with control over the orientation, dimension and location of the nanowires. As-synthesized nanowires are highly uniform in length and diameter with perfect alignment, and are single crystals with a growth direction along [0001].

In one experimental embodiment, the patterns for synthesis of ZnO nanowire arrays were prepared by laser interference lithography of a photoresist employing a photochemical process similar to existing photolithography processes. The epoxy-based negative photoresist SU-8, commonly used in the microelectronics industry, was employed in this embodiment. The laser interference lithography technique was used to generate patterns on the photoresist without use of a mask. When exposed to laser light, the SU-8's long molecular chains cross-link and cause the solidification of the exposed areas. After development, the exposed areas of the SU-8 layer remained and whereas the unexposed areas were removed leaving holes, which served as the mask for the growth of ZnO nanowires.

A 10-ns pulsed Nd:YAG laser (Quanta-Ray PRO 290, Spectra Physics) with wavelength of 266 nm was used as the laser source. The primary laser beam (266 nm) was split into two coherent light beams. Interference between the two beams formed a grating pattern on the photoresist layer under a single laser pulse (10 ns) irradiation. The period of the pattern line spacing d is determined by the wavelength ($\lambda$) of the light and the half-angle ($\theta$) between the two incident beams through the relationship $d=\lambda/2\sin(\theta)$. The sample was then rotated by 90° followed by a second exposure, and patterns of periodic nanodot arrays were formed on the photoresist layer.

Laser interference lithography was used for forming patterns on the SU-8 layer. The negative photoresist SU-8 was spin-coated onto a 2-inch silicon or sapphire wafer. A ZnO texture layer was sputtered on top of the sapphire layer (alternately, a GaN film with surface orientation could be used). The pattern of open-hole arrays was formed uniformly at the unexposed locations of SU-8 layer over the whole wafer area after two consecutive laser exposures with 90° rotation of the substrate between exposures.

The [0001] surface of ZnO layer (or GaN layer) was selectively exposed to a nanowire growth environment for the subsequent growth of aligned ZnO nanowire arrays. To do this, the substrate with patterned SU-8 layer was put facing-downwards into a growth solution, floating on top of the nutrient growth solution for so as to grow nanowires through the holes. Vertically aligned ZnO nanowire arrays were synthesized in a growth solution containing 5 mM zinc nitride (Alfa Aesar) and 5 mM hexamethylenetetramine (HMTA) (Fluka) at 85° C. for 24 hours in a Yamato convection box oven. ZnO nanowires grew at the substrate sites not covered by the SU-8 layer and uniformly patterned ZnO nanowire arrays were obtained at large-scale. The morphology of the ZnO nanowires can be tuned by varying solution concentration, growth temperature and time. The perfectly vertical alignment of ZnO nanowire arrays was achieved due to the lattice match between the grown ZnO [0001] plane and the substrate plane (either a ZnO texture layer or a GaN layer). Both laser interference lithography and hydrothermal methods are carried out at low temperature (below 100° C.) and ambient pressure. It would be straightforward to extend this approach to fabrication of nanostructure arrays of other materials like Si, CdSe, and III-V compounds on various other substrates, such as glass, flexible materials and metals.

Figure 4A:
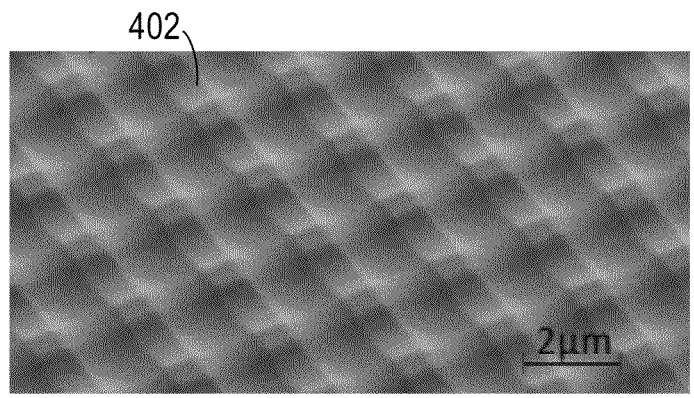
FIG. 4A is a micrograph of a cross-banded photoresist pattern generated in one representative embodiment.
Figure 4B:
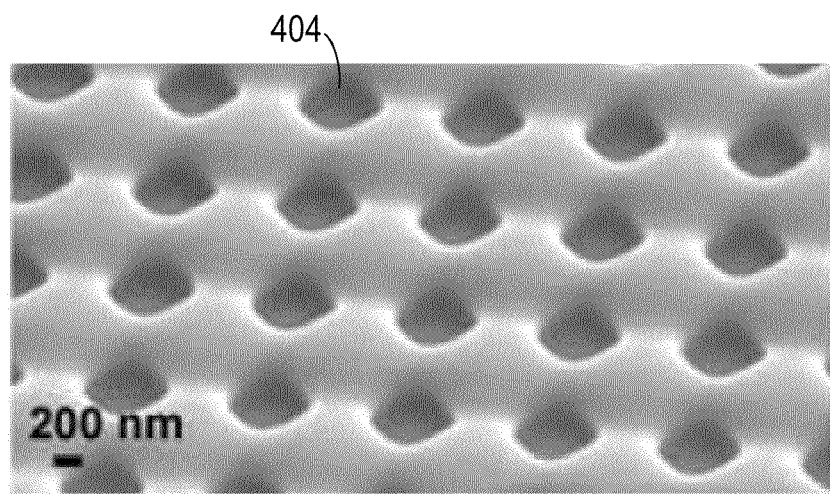
FIG. 4B is a micrograph of an array of holes generated on a photoresist layer according to one representative embodiment.
Figure 4C:
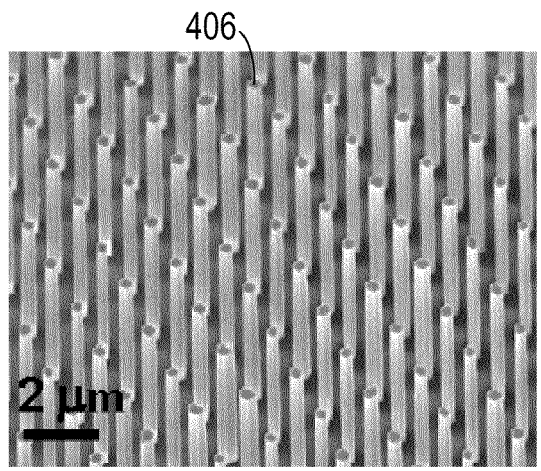
FIG. 4C is a micrograph of an array of vertically aligned nanowires generated according one representative embodiment.

As shown in FIG. 4A, the formed patterns 402 on a SU-8-coated substrate after laser interference lithography patterning were imaged by a thermally-assisted field emission scanning electron microscope (SEM). A Si wafer with SU8 open-hole pattern 404 over the whole surface area is shown in FIG. 4B. The patterned SU-8 film was about 500 nm thick. The pattern had a period of 2 μm and circular holes had a diameter of 600 nm were opened over the surface uniformly using irradiation fluence of 3.5 mJ/cm$^2$ for the laser beams. The sidewalls of the holes were approximately vertical and the substrate was selectively exposed. The shapes, periods of the pattern, and scales of the hole can be adjusted by varying the laser interference patterning parameters, such as the fluence and the aperture size, and other experimental parameters like the angle of rotation applied to the samples between exposures. A detailed study on pattern generation will be discussed later in this article. A micrograph of the resulting nanowire array 406 is shown in FIG. 4C.

Laser interference lithography-Patterned growth of ZnO nanowire arrays were also performed with different periods and sizes of opened-holes on a GaN substrate. An interesting phenomenon was observed when comparing the ZnO nanowire arrays for patterns with different diameters of holes. When the diameter of opened holes was smaller than 600 nm, an individual ZnO nanowire grew out of each hole. All of the nanowires had near perfect vertical alignment with the same diameter and height. When the diameter of opened holes was larger than 1 μm, random growth of ZnO nanowires was observed on the substrate, with different diameters and heights for the grown ZnO nanowires, which is similar to the result obtained for ZnO nanowires growing on un-patterned bare GaN substrates.

In one experimental embodiment, laser interference patterning was conducted using a frequency quadrupled Nd:YAG laser with a 266 nm wavelength, 10 ns pulse width, 10 Hz repetition rate, and maximum 150 mJ energy per pulse (Quanta-Ray PRO 290, Spectra Physics). The P-polarized laser beam was split into two beams by a 50/50 beam splitter (BS) and then recombined at the sample surface with a designed interference angle (θ). The interference of the beams results in a periodic intensity distribution on the substrate, which is generally described by equation:

$$F(x) = 2F_0 \left(1 + \cos\left[\frac{4\pi \sin(\theta/2)}{\lambda} \cdot x + \Delta\phi\right]\right)$$

Where $F_0$ is the intensity of each wave, $\lambda$ is the wavelength, and $\Delta\Phi$ is the phase difference between the two waves. This setup was recently described.[19,20] The interference period (P) is determined by the wavelength (λ) and the angle (θ), and is given by the equation $P=\lambda/2 \sin(\theta/2)$. GaN films, grown on sapphire substrates by metal-organic chemical vapor deposition (MOCVD), were used as the starting materials. FIG. 1 shows the LIA of GaN process. First, the GaN surfaces were structured by two-beam laser interference patterning to achieve line-like patterns on the surface. Then, the first step was repeated after rotating the substrates by 90 degree to achieve the isolated dot-like patterns. The isolated mesas are actually unablated areas for ZnO nanowire growth which can be controlled by laser fluence and the angle of two laser beams.

In one experiment, the pattern diameters are 5 mm, yielding input laser dose of (a) 560 mJ/cm$^2$; (b) 382 mJ/cm$^2$; (c) 306 mJ/cm$^2$; and (d) 153 mJ/cm$^2$. The laser irradiation caused the thermal decomposition of GaN into gaseous nitrogen and Ga droplets which remain on the surface and could be cleaned up by HCl. During laser interference patterning, the GaN surface was selectively ablated by the high-energy nanosecond laser. The resulting surface topography had a pattern which was an inverse of the corresponding laser intensity distribution. Both the height and the size of mesa could be controlled by the input laser fluence. The height increased with increasing exposure dose and followed the widely accepted formula of Beer's law: ablation depth or the height of the mesa $d(F)=1/\alpha_{eff} \ln(F/F_{th})$ at various fluencies (F), the threshold fluence ($F_{th}$), and the effective absorption coefficient ($\alpha_{eff}$).

In order to achieve vertically aligned ZnO nanowire arrays, either by hydrothermal methods or physical vapor deposition methods, matches in the crystallographic orientation and lattice parameter between the substrate material and ZnO are required. Substrates such as single crystalline GaN or ZnO were previously adopted for the nanowire growth. However, the high cost of these substrates may limit potential large-scale applications. Furthermore, applications using substrates of other materials such as polymers and glass may been of more interest due to lower cost and handling considerations. It is hence highly desirable to develop a general method for fabricating vertically aligned ZnO nanowire arrays on essentially any substrates of low cost. The same laser interference lithography patterning and HT nanowire growth sequences were performed on a silicon wafer covered with a polycrystalline ZnO seed layer prepared by RF magnetron sputtering. Multiple ZnO nanowires grew out of each hole due to the random in-plane orientations of the polycrystalline ZnO seeds deposited on the silicon wafer. A textured ZnO seed layer with a flat [0001] surface is hence desirable for subsequent growth of vertically aligned ZnO nanowire arrays and we developed a simple way to prepare large-scale textured ZnO seed layer with a flat [0001] surface at low cost.

In one experimental embodiment to achieve this, a silicon wafer was sputtered with a layer of ZnO with a thickness of about 200 nm in a RF magnetron sputtering system. The wafer was then put facing-downwards into the growth solution, floating on top of the nutrient solution surface for nanowire growth. A dense layer of aligned ZnO nanowires were synthesized in a solution containing 20 mM zinc chloride ($ZnCl_2$) and 20 mM HMTA at 95° C. for 16 hours in a Yamato convection box oven. Ammonium hydroxide ($NH_4OH$) was also added into the solution at a volume concentration of around 4%. Tightly compact ZnO nanowires grown along [0001] direction. Those nanowires had substantially flat top [0001] surfaces and small variation in height. The crystal structure and orientation of the as-grown textured ZnO seed layer were studied by x-ray diffraction (XRD) measurements. The XRD θ-2θ scan showed only two dominant peaks at 34.45° and 72.59°, attributed to the ZnO (0002) and ZnO (0004) planes, respectively. The XRD θ-2θ scan indicates that the surface of textured ZnO seed layer is [0001] oriented. The XRD θ-rocking curve of textured ZnO seed layer was also investigated for peak at 34.45°, with a full width at half maximum (FWHM) value of 1.47°. The small FWHM value indicates good alignment among different [0001] oriented domains of the textured ZnO seed layer.

The textured ZnO seed layer was then used for the growth of vertically aligned ZnO nanowires via laser interference lithography patterning and hydrothermal nanowire growth sequences described previously. The near perfect vertical alignment of ZnO nanowire arrays was homoepitaxially achieved due to ideal match between the [0001] facets of the dense ZnO nanowires achieved in the first growth process and the ZnO nanowires grown on top of them during the second growth process. The hexagonal shape of the nanowire indicates that it was single crystalline with growth direction along [0001]. The nanowires had the same diameter of around 1 μm. All of the nanowires were substantially perfectly aligned normal to the substrate and had essentially the same height of around 2 μm.

The hole diameter and hole periodicity can be controlled by varying the fluence of the primary laser beam and the angle between the interfering beams. Patterns with a fixed period of 2.5 μm but with varying hole diameters were obtained at a fixed angle of 6.3° between the interfering beams. The diameters of the holes were 1 μm, 700 nm and 350 nm respectively in one embodiment, which were generated at fluencies of 1.6, 3.2 and 6.0 mJ/cm$^2$, respectively. For a negative photoresist, the hole diameter decreases with increasing exposure dose. The holes are created at the locations where the exposure dose is lower than the threshold fluence ($F_{th}$) for photocuring of SU-8. SU-8 will not be photocured in these areas and hence will be dissolved in the subsequent developing process to holes.

This experimental embodiment demonstrated an effective approach for controllable wafer-scale fabrication of ZnO nanowire arrays. Laser interference patterning was employed to control the position, size and orientation of synthesized ZnO nanowires, while a hydrothermal chemical method was used to control the morphology and material properties of nanowires. Combinations of both laser interference patterning and the hydrothermal method allow more available access to large-scale uniformly patterned nanostructures at a high-throughput rate and substantially reduced cost, both in time and in equipment resources, providing an efficient approach for fabricating highly-ordered one-dimensional nanostructures at wafer-scale without needing clean room technology. The development of textured ZnO seed layer for replacing single crystalline GaN and ZnO substrates can not only reduce the cost, but also extend the large-scale fabrication of vertically aligned ZnO nanowire arrays on substrates of other materials such as polymers, Si and glass. This combined large-scale nanofabrication approach paves the path towards integrating nanostructures into devices or technology platforms, which are compatible with state-of-art micro/nanofabrication technologies, for applications in energy harvesting, sensing, electronics, optoelectronics, piezotronics and plasmonics.

In one embodiment, a dense layer of aligned ZnO nanowires were grown on the substrate via a low temperature hydrothermal process. The substrate was first sputtered with a layer of ZnO with thickness around 100 nm at room temperature in a RF magnetron sputter. The substrate was then put facing downwards into the growth solution, floating on top of the nutrient solution surface for growth. A dense layer of aligned ZnO nanowires were synthesized in a solution containing 20 mM zinc chloride ($ZnCl_2$) and 20 mM hexamethylenetetramine (HMTA) at 95° C. for 16 hours in a Yamato convection box oven. Ammonium hydroxide ($NH_4OH$) was also added into the solution at a volume concentration of around 4%. Subsequently, the substrate with a dense layer of aligned ZnO nanowires were put facing-downwards into a new growth solution, containing 5 mM zinc nitride (Alfa aesar) and 5 mM hexamethylenetetramine (HMTA) (Fluka), at 85° C. for 24 hours in a Yamato convection box oven for fabrication of vertically aligned ZnO nanowire arrays. The vertical alignment of ZnO nanowire arrays was achieved due to ideal match between the [0001] facets of the dense ZnO nanowires achieved in the first growth process and the ZnO nanowires grown on top of them during the second growth process. It is straightforward to extend this approach to fabricate 1-D nanostructure arrays of other materials like Si, CdSe and III-V compounds on various other substrates, such as glass, flexible materials and metals. The top facets of these nanowires form a flat surface which can be patterned and is perfectly suitable for subsequent fabrication of a vertically aligned nanowire array. Substrates that can sustain high temperature process can also be adopted for fabrication of a vertically aligned nanowire array via physical vapor deposition methods.

A ZnO nanowire array may be employed in a light emitting diode (LED) structure. ZnO-based light emitting diodes may be specifically adaptable for use in blue/near-UV light sources, due to a direct wide band gap energy of 3.37 eV, a large exciton binding energy of 60 meV at room temperature, and several other manufacturing advantages of ZnO. Heterojunctions of n-ZnO and p-GaN are employed due to the similar crystallographic and electronic properties of ZnO and GaN. Because they avoid total internal reflection problems experience by some thin film LED designs, n-ZnO nanowire/p-GaN thin film heterostructures increase the extraction efficiency of the LEDs by virtue of the wave guiding properties of the nanowires.

In one embodiment, the blue/near-UV LEDs include position controlled arrays of n-ZnO nanowires on a p-GaN thin film substrate. The device is fabricated by a conjunction of low temperature wet chemical methods such technologies as laser interference photolithography, photolithography and electron beam lithography (EBL). Under forward bias, each single nanowire is a light emitter. By Gaussian deconvolution of the emission spectrum, the origins of the blue/near-UV emission are assigned particularly to three distinct electron-hole recombination processes. By virtue of the nanowire/thin film heterostructures, these LEDs give an external quantum efficiency of about 2.5%. This approach may have potential applications in high resolution display, optical interconnect, and high density data storage.

Figure 2:
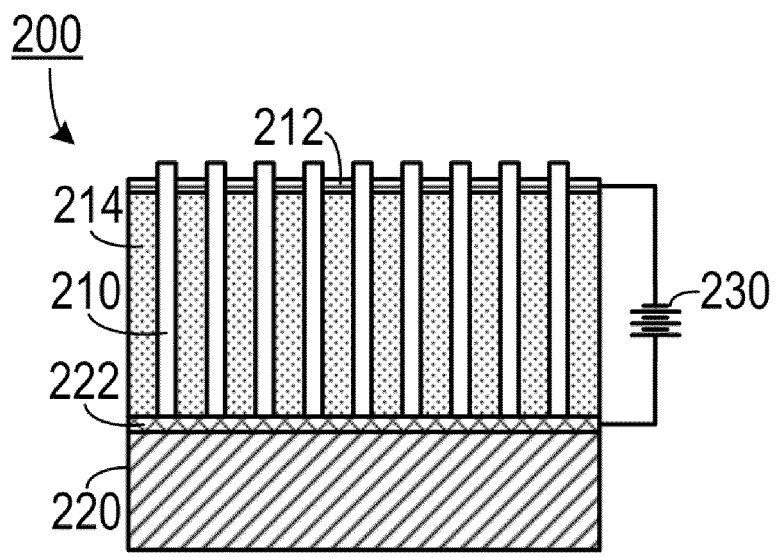
FIG. 2 is a cross sectional view of an embodiment of a light emitting diode array employing an ordered array of ZnO nanowires.

One embodiment of a nanowire array LED 200 is shown in FIG. 2A. An ordered nanowire array of n-doped ZnO 210 is grown on a p-doped GaN substrate 220. A bottom Ohmic contact 222 is applied to the bottom of the nanowire array 210. An insulating layer 214, such as silicon, may be spun coated into the nanowire array 210. A top Ohmic contact 212 is applied to the top nanowire array 210 and a voltage source 230 then biases the nanowire array 210, which generates light in response thereto. All of the nanowires in the nanowire array 210 are connected in parallel between the bottom Ohmic contact 222 and the top Ohmic contact 212 and each single nanowire acts as a light emitter.

The contour of the electroluminescence spectrum of the LED 200 does not change much with the biased voltage when the bias voltage is in the range of 4V to 10V. The dominant emission peak is slightly blue shifted in the range of 400 nm-420 nm with a full width at half maximum (FWHM) of about 60 nm. The peak intensity versus injection current ($L-I^m$) characteristics show a superlinear relationship with m=1.3. Peak-deconvolution with Gaussian functions, shows that the broad spectrum consists of three distinct bands centered in the range of 395-415 nm, 420-440 nm, and 450-510 nm, respectively, and each emission band corresponds to a particular recombination process as elaborated in the following. The near-UV emission band centered at around 400 nm is attributed to the near band edge (NBE) emission in ZnO nanowires that originates from the recombination of ZnO free and bound excitons. Whereas a red shifted violet emission band centered at about 430 nm results from transitions from the conduction band or shallow donors to deep Mg acceptor levels in the p-GaN thin film substrate.

The hole concentration in the Mg-doped p-GaN substrate 220 (p~$10^{18}$ cm$^{-3}$) is higher than the electron concentration in the n-ZnO nanowire (n~$10^{17}$ cm$^{-3}$) array 210, but the carrier mobility in the p-doped GaN is smaller than that in the n-ZnO. The barrier heights at the interface for the holes (0.57 eV) and for the electrons (0.59 eV) are comparably equal. In that case, the charge injection by electrons and holes should be comparable from both sides. The energy band offset at the ZnO/GaN interface is likely to be determined by the fabrication process. The blue emission of around 460 nm is related to the radiative interfacial recombination of the electrons from n-ZnO and holes from p-GaN. The interface states generally act as non-radiative centers that annihilate free electrons and holes. Therefore, it is important to get a high quality interface between the heterojunctions in order to get high efficiency LEDs.

As the biased voltage is increased, intensity of the main peak and all of the four sub-bands (including the defect emission) exponentially increases and also blue shifts. The blue shift has been explained to be caused by several different mechanisms, such as band renormalization and band filling, and the screening effect of the built-in piezoelectric field. In one experimental embodiment, the blue shift of the emission peak comes from two resources: the blue shift of sub-band positions and the change of relative intensities of the sub-bands at different injection currents. The blue shift of the ZnO and GaN NBE emission positions may be caused by the recombination of increasing kinetic energies of electrons and holes as the biased voltage is increased, assuming the mobility of the carriers does not change too much when the biased voltage is not too high, and that could contribute to the energy of the emitted photons. The most obvious blue shift of the peak position comes from the interfacial recombination process. As the biased voltage is increases, the gap between the two quasi-Femi levels is increased, and the interfacial recombination energy of the electrons from ZnO side and holes from GaN side goes up.

ZnO nanowires exhibit wave guiding properties, which is a solution to the total internal reflection problems associated with several existing LED technologies. The following formula applies under the single mode waveguide cavity conditions:

$$V = 2\pi \frac{a}{\lambda_o}(n_1^2 - n_2^2)^{\frac{1}{2}} = 2.405.$$

Under these conditions, 85% the light would be confined within a 223 nm nanowire, where V is the single mode cut-off value, a is the diameter of the nanowire, $\lambda_o$ is the free space wavelength of the propagating light (here we set it to be 400 nm), and $n_1$ (2.10) and $n_2$ (1.59) are the effective refractive index of the ZnO nanowire and the cladding PMMA thin film, respectively. To note, the facets of the nanowire are assumed to be perfectly flat under the single mode conditions. In reality, these nanowires have rounded tips, a large surface to volume ratio, and thus a high density of surface states near the band edge, which allows a substantial reduction of the back reflections at the ZnO nanowire surfaces, known as the omnidirectional reflector effect. Also, based on an effective medium theory, these graded refractive indices of GaN (2.49), ZnO (2.10) and PMMA (1.59) could largely reduce the Fresnel reflection between GaN/ZnO and ZnO/PMMA interfaces, which helps the optical transmission. By virtue of these advantages, the light could easily be extracted out through multiple scattering. ZnO nanowires have a transmittance of over 90% in the visible range, so the self-absorption of the nanowires should not be the major concern. Also, patterned ZnO nanowire arrays form a two-dimensional photonic crystal, which has an optical band gap for the light traveling parallel to the surface of the substrate. So by controlling the periodicity of the nanowire arrays, it should be possible to match the wavelength of the emitted light to the band gap of the photonic crystal, resulting in normal directional emission of the light.

The external quantum efficiency was calculated by acquiring the ratio of the output light power and the input electrical power. The external quantum efficiency of the LED is about 2.5%, which is considerably high for a single p-n junction based LEDs, and such data are reproducible and consistent for several devices. As the biased voltage/injection current is gradually increased, the external quantum efficiency becomes steady, which indicates that the serial resistance or the nonradiative recombination through the defects, e.g. Auger recombination, does not increase in proportion with increasing the injection current.

In one experimental embodiment, after the growth of ZnO nanowire arrays, a 30-nm by 30-nm layers of Ni/Au were deposited by electron beam evaporation on the p-GaN followed by rapid thermal annealing in air at 500° C. for 5 minutes. A 50-nm conformal layer of $SiO_2$ was deposited onto the nanowire arrays by plasma-enhanced chemical vapor deposition (PECVD.) After that, a relatively thick layer of poly(methyl methacrylate) (PMMA) was carefully spun coated onto the substrate to wrap around the nanowires. During this process, the $SiO_2$ layer protected the nanowires from falling down onto the substrate due to the surface tension of the PMMA. Oxygen plasma was applied to etch away the top part of the PMMA followed by reactive ion etching (RIE) to remove the top $SiO_2$, exposing the tips of the nanowires. Since the oxygen plasma and RIE were only applied to the tip part of the nanowires, the damage/deterioration they might have induced to the electrical and optical properties of the nanowires could be neglected. Then, a 100-nm layer of ITO was sputtered as the top common electrode of nanowires.

Figure 3:
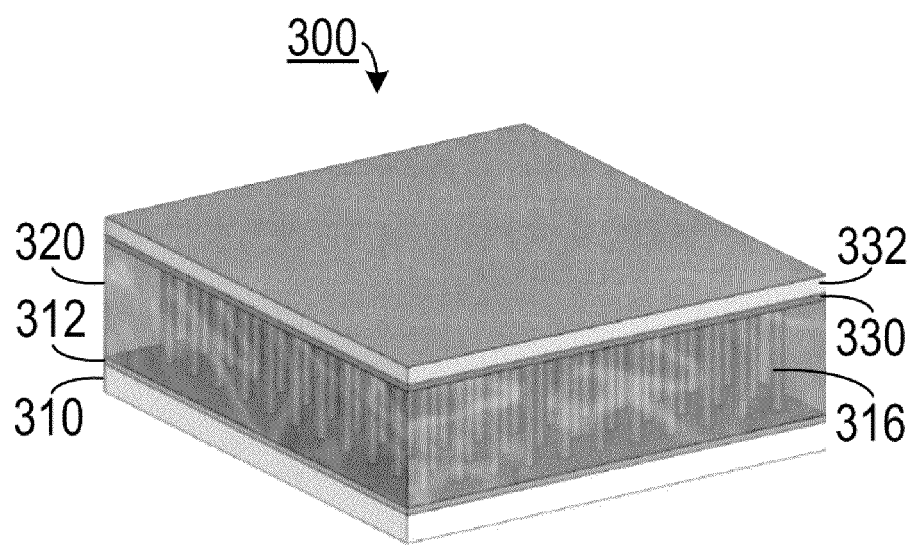
FIG. 3 is a perspective view of an embodiment of an energy harvesting device employing an ordered array of ZnO nanowires.

In one embodiment, as shown in FIG. 3, a system 300 for harvesting light energy and mechanical energy employs aligned ZnO nanowire arrays grown on the surface of a flat transparent substrate. A dye-sensitized solar cell is built by wrapping around the n-type ZnO nanowires with p-type polymers to form a pn junction that can utilize solar energy, and a piezoelectric nanogenerator is built by placing a top solid electrode on the nanowires. The two energy harvesting approaches can work simultaneously or individually, and multiple of them can be integrated together in parallel and serial for raising the output current and voltage, respectively.

In one experimental embodiment, the vertically aligned ZnO nanowire arrays were grown on a common transparent substrate 310 by hydrothermal decomposition. First, the substrate 310 was cleaned by a standard cleaning procedure. Then the substrate 310 was ultrasonicated consecutively in acetone, ethanol, IPA (isopropyl alcohol) and de-ionized water each for 10 minutes, then blow dried with nitrogen gas. On the substrate 300, a layer of 50 nm ITO (not shown) was coated by magnetron sputtering under 25 sccm Ar and 75 W radio frequencies with 12% tune and 63% load. The deposition rate was about 0.5 angstroms per second. On top of the ITO layer, a layer of ZnO seed 312 was coated by magnetron sputtering under 25 sccm Ar and 75 W radio frequencies with 10% tune and 60% load. The deposition rate was about 0.4 angstrom per second. After that, the ZnO seed was annealed at 300° C. to improve the normal orientation of the ZnO seed to [0001].

The growth of ZnO nanowire array 316 took place in the 5 mM 1:1 ratio of zinc nitrate and hexamethylenetetramine solution in a way that the substrate is floating with facing down on the surface of the nutrient solution due to surface tension of nutrient solution, which resulted in the immersion of the ZnO seed layer inside the nutrient solution. The growth took place at 80° C. in a mechanical convection oven for 10 hours. After the whole system was cooled down to room temperature, then the ZnO nanowire array 316 was rinsed with ethanol to remove any organic residues adsorbed on the ZnO nanowire surface.

After that, a relatively thick layer 320 of P3HT:PCBM blend polymer was spun coated onto the substrate to wrap around the nanowires at a rotation speed of 3500 rotation per minute for 60 seconds. This thick layer 320 of P3HT:PCBM blend polymer formed a pn junction with the n-type ZnO nanowires. Then a 100 nm thick gold layer 330 was applied by magnetron sputtering. On top of the gold, a $MoO_x$ layer 332 was applied with magnetron sputtering. The gold layer 330 acts as a conducting layer and the MoO$_x$ layer 332 acts as an electron blocking layer for the solar cells.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of making a light emitting structure, comprising the steps of:
   (a) growing a n-doped ZnO nanowire array from a p-doped substrate;
   (b) depositing a first conductive layer onto the p-doped substrate so as to form an Ohmic contact with the n-doped ZnO nanowire array;
   (c) depositing an insulating layer onto the first conductive layer; and
   (d) depositing a second conductive layer onto the insulative layer so as to form an Ohmic contact with the n-doped nanowire array.

2. The method of claim 1, further comprising an insulating layer disposed between the first conductive layer and the second conductive layer.

3. The method of claim 2, wherein the insulating layer comprises PMMA.

4. The method of claim 1, wherein the crystalline substrate comprises p-doped GaN.

5. The method of claim 4, wherein the p-doped GaN is doped with Mg.

6. The method of claim 1, wherein the step of growing a n-doped ZnO nanowire array comprises the steps of:
   (a) placing a photoresist layer onto a nanowire growth layer configured for growing nanowires therefrom;
   (b) exposing the photoresist layer to a coherent light interference pattern that includes periodically alternately spaced dark bands and light bands along a first orientation;
   (c) exposing the photoresist layer to the coherent light interference pattern along a second orientation, transverse to the first orientation;
   (d) developing the photoresist layer so as to remove photoresist from areas corresponding to areas of intersection of the dark bands of the interference pattern along the first orientation and the dark bands of the interference pattern along the second orientation, thereby leaving an ordered array of holes passing through the photoresist layer; and
   (e) placing the photoresist layer and the nanowire growth layer into a nanowire growth environment, thereby growing nanowires from the nanowire growth layer through the array of holes.

7. The method of claim 6, wherein the second orientation has an angular distance of 90° from the first orientation.

8. The method of claim 6, wherein the coherent light interference pattern is generated by steps comprising:
   (a) generating a first laser beam;
   (b) splitting a the first laser beam using a beam splitter to generate a second laser beam; and
   (c) directing the first laser beam and the second laser beam onto the photoresist layer so that the second laser beam and the first laser beam form the interference pattern.

9. The method of claim 6, wherein the nanowire growth layer are generated using steps comprising:
   (a) applying a ZnO seed layer to a substrate; and
   (b) growing a dense layer of nanowires from the seed layer.

10. A light emitting structure, comprising:
    (a) a crystalline substrate that is doped with a p-type material;
    (b) an ordered array of n-doped ZnO nanowires extending upwardly from the crystalline substrate;
    (c) a first conductive layer disposed adjacent to the crystalline substrate so as to form an Ohmic contact with the n-doped ZnO nanowires;
    (d) a second conductive layer, spaced apart from the first conductive layer, disposed so as to form an Ohmic contact with the n-doped ZnO nanowires;
    (e) a voltage source configured to apply a voltage, between the first conductive layer and the second conductive layer, sufficient to cause the n-doped ZnO nanowires to emit light.

11. The light emitting structure of claim 10, further comprising an insulating layer disposed between the first conductive layer and the second conductive layer.

12. The light emitting structure of claim 11, wherein the insulating layer comprises PMMA.

13. The light emitting structure of claim 10, wherein the crystalline substrate comprises p-doped GaN.

14. The light emitting structure of claim 13, wherein the p-doped GaN is doped with Mg.

15. A method for growing a nanowire array, comprising the steps of:
    (a) placing a photoresist layer onto a nanowire growth layer configured for growing nanowires therefrom;
    (b) exposing the photoresist layer to a coherent light interference pattern that includes periodically alternately spaced dark bands and light bands along a first orientation;
    (c) exposing the photoresist layer to the coherent light interference pattern along a second orientation, transverse to the first orientation;
    (d) developing the photoresist layer so as to remove photoresist from areas corresponding to areas of intersection of the dark bands of the interference pattern along the first orientation and the dark bands of the interference pattern along the second orientation, thereby leaving an ordered array of holes passing through the photoresist layer; and
    (e) placing the photoresist layer and the nanowire growth layer into a nanowire growth environment, thereby growing nanowires from the nanowire growth layer through the array of holes.

16. The method of claim 15, wherein the second orientation has an angular distance of 90° from the first orientation.

17. The method of claim 15, wherein the coherent light interference pattern is generated by steps comprising:
    (a) generating a first laser beam;
    (b) splitting a the first laser beam using a beam splitter to generate a second laser beam; and
    (c) directing the first laser beam and the second laser beam onto the photoresist layer so that the second laser beam and the first laser beam form the interference pattern.

18. The method of claim 15, wherein the nanowire growth layer are generated using steps comprising:
    (a) applying a ZnO seed layer to a substrate; and
    (b) growing a dense layer of nanowires from the seed layer.

* * * * *